US012754233B2

(12) United States Patent
Onaka et al.

(10) Patent No.: US 12,754,233 B2
(45) Date of Patent: Oct. 6, 2026

(54) DEVICE INSPECTION APPARATUS AND DEVICE INSPECTION METHOD

(71) Applicant: Mitsubishi Electric Corporation, Tokyo (JP)

(72) Inventors: Takayuki Onaka, Tokyo (JP); Tetsuhiro Fukao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 257 days.

(21) Appl. No.: 18/729,696

(22) PCT Filed: Feb. 21, 2022

(86) PCT No.: PCT/JP2022/006941
§ 371 (c)(1),
(2) Date: Jul. 17, 2024

(87) PCT Pub. No.: WO2023/157291
PCT Pub. Date: Aug. 24, 2023

(65) Prior Publication Data
US 2025/0102566 A1 Mar. 27, 2025

(51) Int. Cl.
*G01R 31/28* (2006.01)
*G01R 35/00* (2006.01)
*H10P 74/00* (2026.01)

(52) U.S. Cl.
CPC ..... *G01R 31/2886* (2013.01); *G01R 31/2851* (2013.01); *G01R 35/00* (2013.01); *H10P 74/00* (2026.01)

(58) Field of Classification Search
CPC ............ G01R 31/2886; G01R 31/2894; G01R 35/00; G01R 31/2851; H10P 74/00
See application file for complete search history.

(56) References Cited

U.S. PATENT DOCUMENTS 6,906,341 B2 * 6/2005 Byun ................. G01R 31/2886 438/11
2020/0064398 A1 2/2020 Uchida et al.
2021/0199713 A1 7/2021 Sakai et al.

FOREIGN PATENT DOCUMENTS

JP H04-249335 A 9/1992
JP 2004-055837 A 2/2004
(Continued)

OTHER PUBLICATIONS

"Notice of Reasons for Refusal" Office Action issued in JP 2022-542725; mailed by the Japanese Patent Office on Oct. 18, 2022.
(Continued)

*Primary Examiner* — Amy He
(74) *Attorney, Agent, or Firm* — Studebaker Brackett PLLC

(57) ABSTRACT

A device inspection apparatus comprises: a plurality of probe heads; an inspection circuitry to measure inspection value data for each semiconductor device; a storage circuitry to store inspection result data including the inspection value data and a determination result on the semiconductor device; and an analysis circuitry to perform, by statistical processing based on a plurality of the inspection result data present for each inspection item and stored in the storage circuitry, an analysis to determine if there is a significant difference between a plurality of the inspection result data for each of the probe heads, and determines that a probe head concerned is abnormal if there is a significant difference.

20 Claims, 10 Drawing Sheets

(56) References Cited

FOREIGN PATENT DOCUMENTS

| | | | |
|---|---|---|---|
| JP | 2018-170418 | A | 11/2018 |
| JP | 2021-025971 | A | 2/2021 |
| WO | 2020/075327 | A1 | 4/2020 |

OTHER PUBLICATIONS

International Search Report issued in PCT/JP2022/006941; mailed May 17, 2022.

* cited by examiner

FIG. 5

61

| | PH1 | PH2 | PH3 |
|---|---|---|---|
| JAN. 1 | d1a0101 | d2a0101 | d3a0101 |
| JAN. 2 | d1a0201 | d2a0201 | d3a0201 |
| JAN. 3 | d1a0301 | d2a0301 | d3a0301 |
| JAN. 4 | d1a0401 | d2a0401 | d3a0401 |
| JAN. 5 | d1a0501 | d2a0501 | d3a0501 |
| JAN. 6 | d1a0601 | d2a0601 | d3a0601 |
| JAN. 7 | d1a0701 | d2a0701 | d3a0701 |
| JAN. 8 | d1a0801 | d2a0801 | d3a0801 |
| JAN. 9 | d1a0901 | d2a0901 | d3a0901 |
| JAN. 10 | d1a1001 | d2a1001 | d3a1001 |
| JAN. 11 | d1a1101 | d2a1101 | d3a1101 |
| JAN. 12 | d1a1201 | d2a1201 | d3a1201 |
| JAN. 13 | d1a1301 | d2a1301 | d3a1301 |
| JAN. 14 | d1a1401 | d2a1401 | d3a1401 |
| JAN. 15 | d1a1501 | d2a1501 | d3a1501 |

FIG.6

62

| | PH1 | PH2 | PH3 |
|---|---|---|---|
| JAN. 1 | d1a01m | d2a01m | d3a01m |
| JAN. 2 | d1a02m | d2a02m | d3a02m |
| JAN. 3 | d1a03m | d2a03m | d3a03m |
| JAN. 4 | d1a04m | d2a04m | d3a04m |
| JAN. 5 | d1a05m | d2a05m | d3a05m |
| JAN. 6 | d1a06m | d2a06m | d3a06m |
| JAN. 7 | d1a07m | d2a07m | d3a07m |
| JAN. 8 | d1a08m | d2a08m | d3a08m |
| JAN. 9 | d1a09m | d2a09m | d3a09m |
| JAN. 10 | d1a10m | d2a10m | d3a10m |
| JAN. 11 | d1a11m | d2a11m | d3a11m |
| JAN. 12 | d1a12m | d2a12m | d3a12m |
| JAN. 13 | d1a13m | d2a13m | d3a13m |
| JAN. 14 | d1a14m | d2a14m | d3a14m |
| JAN. 15 | d1a15m | d2a15m | d3a15m |

FIG. 7

63

| | PH1 | PH2 | PH3 |
|---|---|---|---|
| JAN. 1 | 100 | 115 | 66 |
| JAN. 2 | 109 | 113 | 68 |
| JAN. 3 | 105 | 117 | 67 |
| JAN. 4 | 105 | 115 | 59 |
| JAN. 5 | 113 | 105 | 55 |
| JAN. 6 | 107 | 106 | 65 |
| JAN. 7 | 101 | 112 | 64 |
| JAN. 8 | 105 | 101 | 6 |
| JAN. 9 | 103 | 110 | 0 |
| JAN. 10 | 102 | 114 | 6 |
| JAN. 11 | 108 | 114 | 3 |
| JAN. 12 | 112 | 102 | 0 |
| JAN. 13 | 113 | 112 | 1 |
| JAN. 14 | 103 | 101 | 8 |
| JAN. 15 | 106 | 114 | 10 |

FIG. 8

64

| | PH1 | PH2 | PH3 | ··· | PHN |
|---|---|---|---|---|---|
| JAN. 1 | 100 | 115 | 66 | | 117 |
| JAN. 2 | 109 | 113 | 68 | | 111 |
| JAN. 3 | 105 | 117 | 67 | | 104 |
| JAN. 4 | 105 | 115 | 59 | | 120 |
| JAN. 5 | 113 | 105 | 55 | | 115 |
| JAN. 6 | 107 | 106 | 65 | | 103 |
| JAN. 7 | 101 | 112 | 64 | | 107 |
| JAN. 8 | 105 | 101 | 6 | ··· | 102 |
| JAN. 9 | 103 | 110 | 0 | | 105 |
| JAN. 10 | 102 | 114 | 6 | | 116 |
| JAN. 11 | 108 | 114 | 3 | | 116 |
| JAN. 12 | 112 | 102 | 0 | | 105 |
| JAN. 13 | 113 | 112 | 1 | | 108 |
| JAN. 14 | 103 | 101 | 8 | | 103 |
| JAN. 15 | 106 | 114 | 10 | | 104 |

TARGET RANGE

FIG. 12

65

| | 1 TIME | 2 TIMES | 3 TIMES | ... | m TIMES |
|---|---|---|---|---|---|
| JAN. 1 | d1a0101 | d1a0102 | d1a0103 | | d1a01m |
| JAN. 2 | d1a0201 | d1a0202 | d1a0203 | | d1a02m |
| JAN. 3 | d1a0301 | d1a0302 | d1a0303 | | d1a03m |
| JAN. 4 | d1a0401 | d1a0402 | d1a0403 | | d1a04m |
| JAN. 5 | d1a0501 | d1a0502 | d1a0503 | | d1a05m |
| JAN. 6 | d1a0601 | d1a0602 | d1a0603 | | d1a06m |
| JAN. 7 | d1a0701 | d1a0702 | d1a0703 | | d1a07m |
| JAN. 8 | d1a0801 | d1a0802 | d1a0803 | ... | d1a08m |
| JAN. 9 | d1a0901 | d1a0902 | d1a0903 | | d1a09m |
| JAN. 10 | d1a1001 | d1a1002 | d1a1003 | | d1a10m |
| JAN. 11 | d1a1101 | d1a1102 | d1a1103 | | d1a11m |
| JAN. 12 | d1a1201 | d1a1202 | d1a1203 | | d1a12m |
| JAN. 13 | d1a1301 | d1a1302 | d1a1303 | | d1a13m |
| JAN. 14 | d1a1401 | d1a1402 | d1a1403 | | d1a14m |
| JAN. 15 | d1a1501 | d1a1502 | d1a1503 | | d1a15m |

DEVICE INSPECTION APPARATUS AND DEVICE INSPECTION METHOD

TECHNICAL FIELD

The present application relates to a device inspection apparatus and a device inspection method.

BACKGROUND ART

A plurality of semiconductor devices formed on a semiconductor wafer are inspected by bringing probes into contact with electrodes of the semiconductor devices at a stage where all processes on the semiconductor wafer are finished. Patent Document 1 discloses a prober apparatus for inspecting a plurality of chips formed on a semiconductor wafer in parallel in a wafer state, and an inspection method for the semiconductor devices. As the number of chips to be inspected increases, the contact resistance between a probe block and an electrode of a chip increases, and thus the chip is erroneously determined to be a defective device. The inspection method for the semiconductor device using the prober apparatus of Patent Document 1 executes a step of selecting a chip to be re-inspected, a step of cleaning a plurality of probe blocks, and a step of selecting one probe block to be used for a re-inspection from the plurality of probe blocks used for parallel inspection of the plurality of chips, in order to relieve by the re-inspection, the chip erroneously determined as a defective device as the number of chips to be inspected increases.

CITATION LIST

Patent Document

Patent Document 1: Japanese Patent Application Laid-Open No. 2004-55837 (FIG. 9, FIG. 10)

SUMMARY OF INVENTION

Problems to be Solved by Invention

A device inspection for inspecting electrical characteristics or the like in a semiconductor device as an inspection target may be performed not only in a wafer state but also in a separated chip state. In the device inspection for inspecting the inspection target, there is a method for performing the inspection by bringing electrodes of the inspection target into contact with a plurality of probes attached to a probe head. The probe head includes the plurality of probes and corresponds to the probe block of Patent Document 1. At the time of the device inspection, an abnormality of the probe that causes a contact failure between the inspection target and the probe may occur. When such an abnormality of the probe occurs, a problem arises in that a non-defective device is erroneously determined to be a defective device.

In the inspection method for a semiconductor device using the prober apparatus of Patent Document 1, a chip determined to be a defective device is re-inspected without replacing the wafer by using a probe block that is selected and cleaned on the basis of the inspection result in the wafer including the chip after all chips of the wafer are inspected. A non-defective rate for each of probe blocks used in the parallel inspection is calculated, and the probe block having the maximum in the non-defective rate for each of the probe blocks is selected as the probe block for the re-inspection.

The inspection method for the semiconductor device using the prober apparatus of Patent Document 1 can reduce the erroneous determination. However, in the inspection method for the semiconductor device using the prober apparatus of Patent Document 1, since the non-defective rate for each of the probe blocks is calculated on the basis of the inspection result read out after all the chips of the wafer are inspected, the abnormality of a probe block (probe head) cannot be detected in the inspection before the re-inspection, that is, in the first inspection.

An object of a technology disclosed in the specification of the present application is to detect an abnormality of a probe head together with a result of an inspection target when a device inspection of the inspection target is finished.

Means for Solving Problems

An example of a device inspection apparatus disclosed in the present application includes a housing in which the plurality of semiconductor devices are mounted, a plurality of probe heads having probes to be in contact with electrodes of each semiconductor device and used individually for each of the semiconductor devices, an inspection unit to measure inspection value data for each of the semiconductor devices by applying an electric signal for each of the plurality of semiconductor devices for the plurality of semiconductor devices, and an inspection determination unit to determine whether the semiconductor devices are non-defective or defective on a basis of the inspection value data. The example of the device inspection apparatus disclosed in the present application further includes a storage unit to store inspection result data including the inspection value data and the determination result on the semiconductor devices, an analysis unit to analyze whether or not there is a significant difference between a plurality of the inspection result data for each of the probe heads by statistical processing based on a plurality of the inspection result data present for each of inspection items and stored in the storage unit and to determine that a probe head concerned is abnormal if there is a significant difference, and a warning unit to indicate a result of abnormality determination in the analysis unit that the probe head concerned is abnormal.

Effect of Invention

Since the device inspection apparatus of an example disclosed in the specification of the present application analyzes whether or not there is a significant difference between a plurality of the inspection result data for each of the probe heads by statistical processing based on a plurality of the inspection result data stored in the storage unit, it is possible to detect the abnormality of a probe head together with the result of the inspection target when the device inspection of the inspection target is finished.

BRIEF DESCRIPTION OF DRAWINGS

FIG. 5 is a diagram showing an example of an inspection result according to Embodiment 1.

FIG. 6 is a diagram showing an example of an inspection result according to Embodiment 1.

FIG. 7 is a diagram showing an example of an inspection result according to Embodiment 1.

FIG. 8 is a diagram showing an example of an inspection result according to Embodiment 1.

FIG. 12 is a diagram showing an example of an inspection result according to Embodiment 2.

MODE FOR CARRYING OUT INVENTION

Embodiment 1

Figure 1:
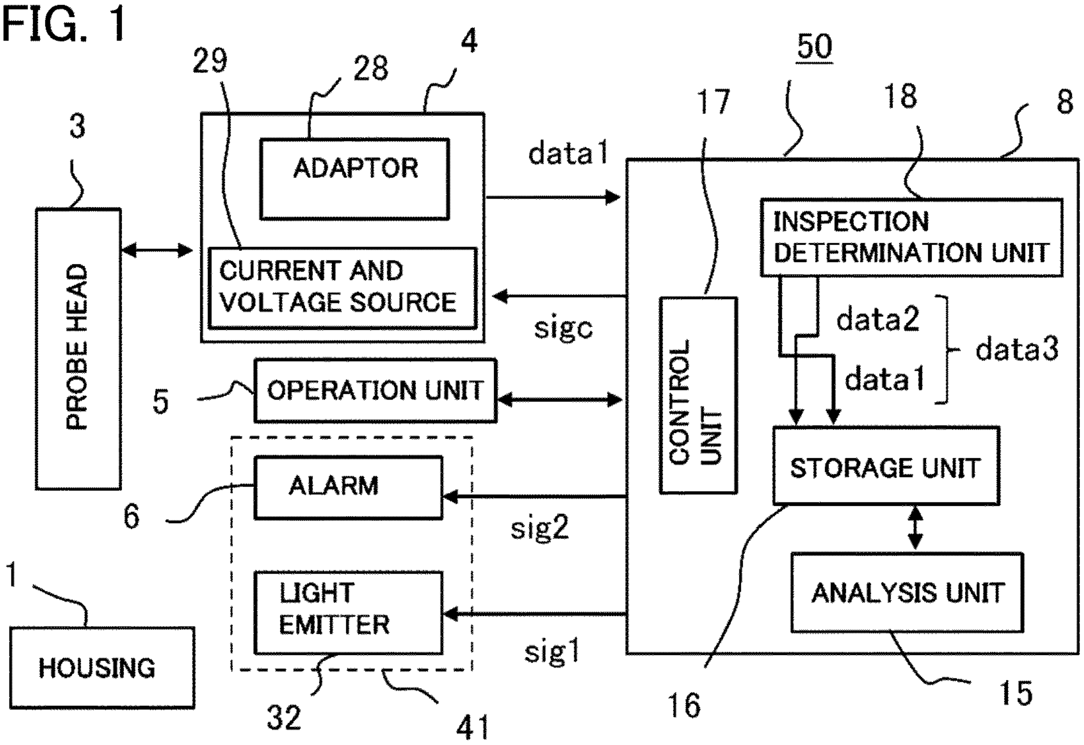
FIG. 1 is a diagram showing a configuration of a device inspection apparatus according to Embodiment 1.
Figure 2:
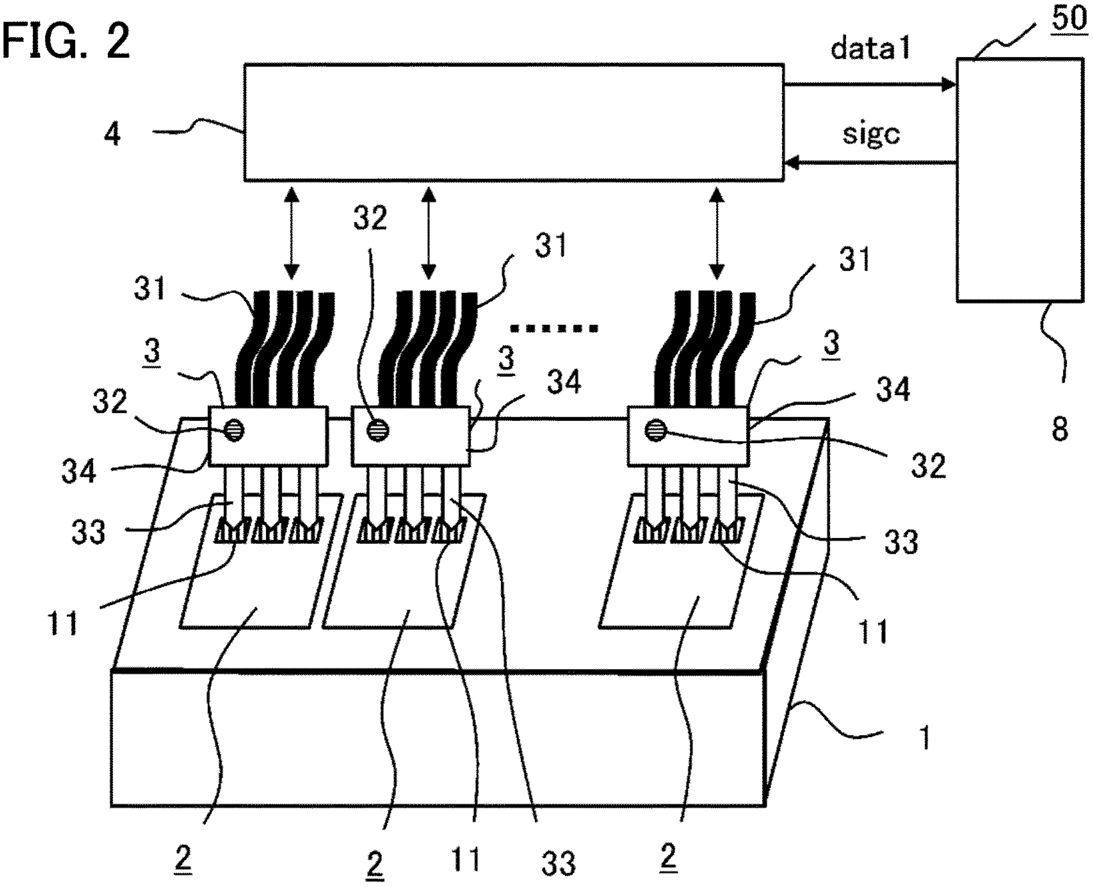
FIG. 2 is a diagram showing inspection targets mounted on a housing and probe heads shown in FIG. 1.
Figure 3:
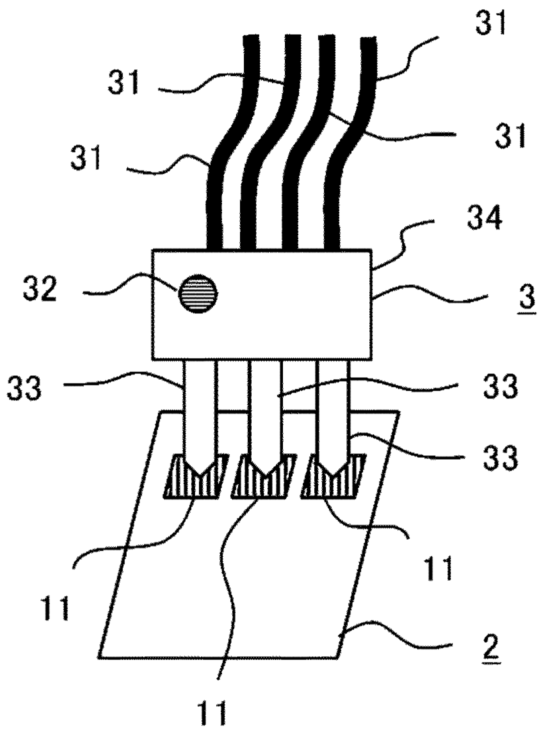
FIG. 3 is a diagram showing a probe head and an inspection target shown in FIG. 2.
Figure 4:
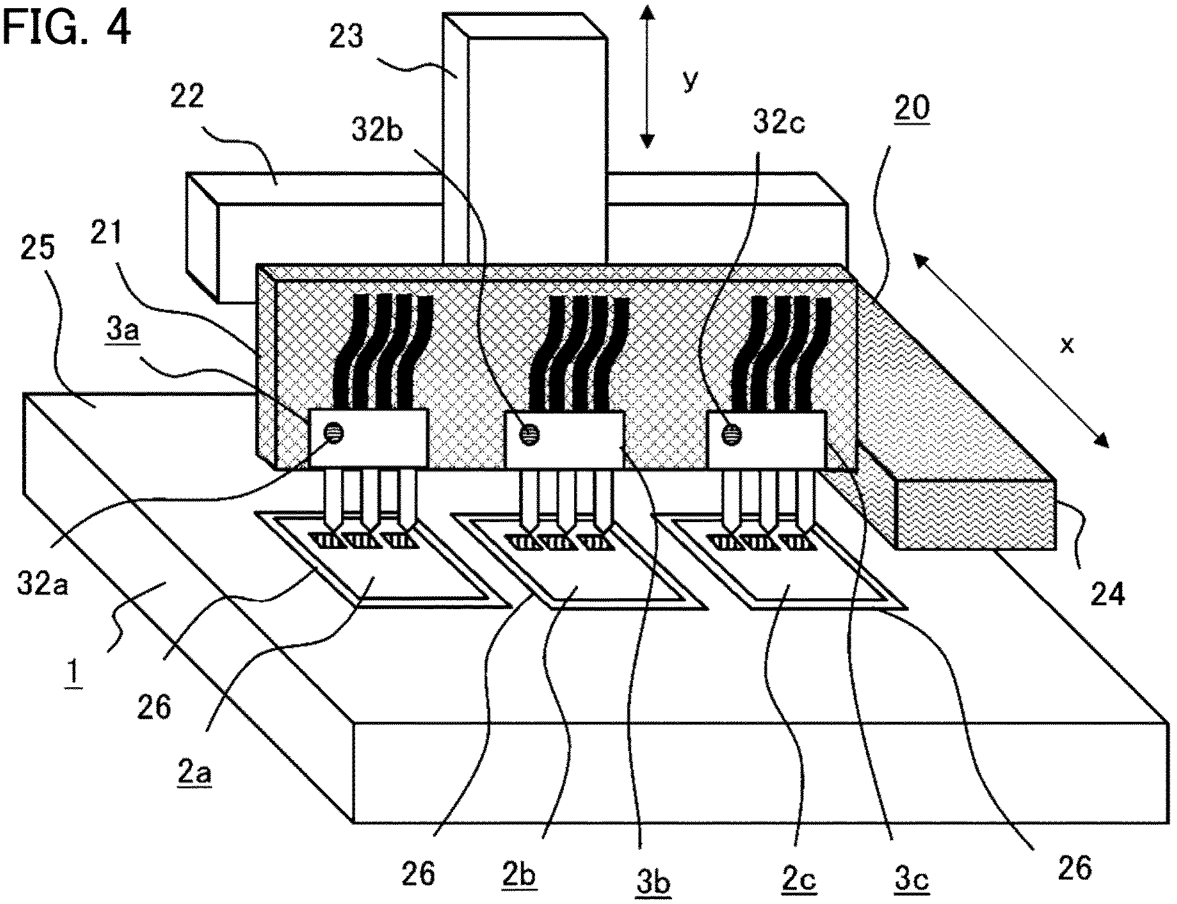
FIG. 4 is a diagram showing a moving mechanism of the probe head shown in FIG. 2.
Figure 9:
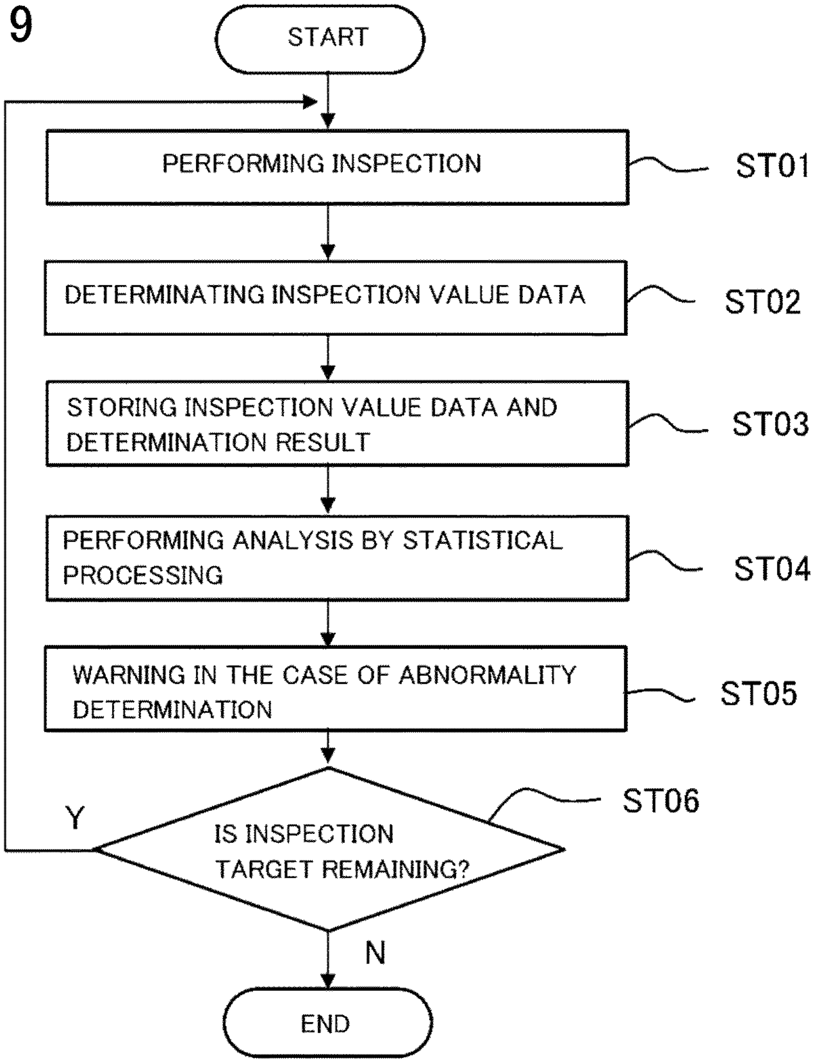
FIG. 9 is a flowchart showing a device inspection method according to Embodiment 1.
Figure 10:
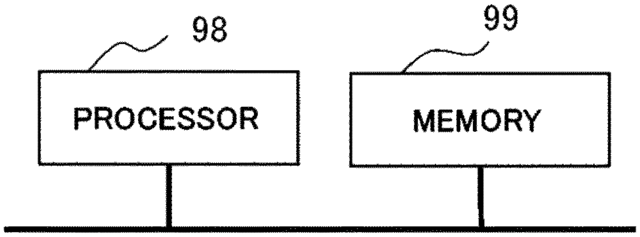
FIG. 10 is a diagram showing an example of a hardware configuration for implementing functions of a control unit, an inspection determination unit, and an analysis unit shown in FIG. 1.

FIG. 1 is a diagram showing a configuration of a device inspection apparatus according to Embodiment 1. FIG. 2 is a diagram showing inspection targets mounted on a housing and probe heads shown in FIG. 1, and FIG. 3 is a diagram showing a probe head and an inspection target shown in FIG. 2. FIG. 4 is a diagram showing a moving mechanism of the probe head shown in FIG. 2. FIG. 5 to FIG. 8 are diagrams showing examples of inspection results according to Embodiment 1. FIG. 9 is a flowchart showing a device inspection method according to Embodiment 1, and FIG. 10 is a diagram showing an example of a hardware configuration for implementing functions of a control unit, an inspection determination unit, and an analysis unit shown in FIG. 1. A device inspection apparatus 50 of Embodiment 1 includes a housing 1 in which semiconductor devices 2 as inspection targets are mounted, at least one probe head 3 having a plurality of probes 33, an inspection unit 4 to measure inspection value data data1 of the semiconductor devices 2 by applying electric signals to the semiconductor devices 2, a computer 8 to control the inspection unit 4, to determine whether the semiconductor devices 2 are non-defective, and to determine whether the probe head 3 is defective, a warning unit 41 to indicate a result of abnormality determination of the probe head 3, a moving mechanism 20 to move the probe head 3, and an operation unit 5 to operate the computer 8 and the moving mechanism 20. The operation unit 5 is, for example, a touch panel display.

FIG. 2 shows an example of the device inspection apparatus 50 for inspecting a plurality of semiconductor devices 2 in parallel, and FIG. 4 shows the moving mechanism 20 in the device inspection apparatus 50 in a case where three semiconductor devices 2 are inspected in parallel. The moving mechanism 20 includes an actuator 24 for moving a head fixing plate 21 to which a plurality of probe heads 3*a*, 3*b*, and 3*c* are fixed, in an x-direction parallel to a device mounting surface 25 of the housing 1, and an air cylinder 23 for moving the head fixing plate 21 in a y-direction perpendicular to the device mounting surface 25 of the housing 1. The y-direction is perpendicular to the x-direction. In FIG. 4, the x-direction is a direction from the near side to the far side of the paper surface, and the y-direction is a direction from the near side to the far side of the device mounting surface 25. The moving mechanism 20 includes an air cylinder fixing plate 22 to which the air cylinder 23 is fixed. The air cylinder 23 holds the head fixing plate 21 to which the plurality of probe heads 3*a*, 3*b*, and 3*c* are fixed, and moves the head fixing plate 21 in the y-direction. The air cylinder fixing plate 22 is moved in the x-direction by the actuator 24. Note that a moving mechanism 20 in the device inspection apparatus 50 for inspecting N semiconductor devices 2 in parallel is the same as the moving mechanism 20 shown in FIG. 4. N probe heads 3 are to be fixed to the head fixing plate 21.

The semiconductor device 2 as the inspection target is, for example, an infrared sensor. The infrared sensor is a module in which a plurality of components are mounted on a substrate such as a glass epoxy substrate. The infrared sensor includes electronic components such as an infrared sensor chip having a temperature sensor formed of a photodiode, a control circuit or a control integrated circuit (IC) that controls the infrared sensor chip, and a capacitor. In FIG. 2 to FIG. 4, only three of a plurality of electrodes 11 in the semiconductor device 2 are shown. An electrode 11 is, for example, an anode or a cathode of the photodiode, an input/output electrode of the control circuit, or the like. The electrodes 11 of the semiconductor device 2 are formed on a substrate such as the glass epoxy substrate. The probe head 3 and the semiconductor device 2 to be inspected are in one-to-one correspondence, and the number of the probe head 3 and the number of the semiconductor device 2 to be inspected are the same.

The probe head 3 includes a main part 34, the plurality of probes 33 fixed to the main part 34, and a cable 31 connected to each of the plurality of probes 33. In FIG. 2 to FIG. 4, since a light emitter 32 is provided in the main part 34 of the probe head 3, a cable 31 for transmitting a signal for causing the light emitter 32 to emit light is also present. Note that the number of the cables 31 is not limited to the number of the cables shown in a figure. FIG. 4 shows a case in which there are three probe heads 3 and three semiconductor devices 2, and reference numerals 3*a*, 3*b*, and 3*c* are assigned to distinguish the three probe heads 3. Similarly, reference numerals 2*a*, 2*b*, and 2*c* are assigned to distinguish the three semiconductor devices 2, and reference numerals 32*a*, 32*b*, and 32*c* are assigned to distinguish the three light emitters 32. That is, the reference numeral 3 is collectively used for the probe heads, and 3*a*, 3*b*, and 3*c* are used when the probe heads are distinguished from each other. The reference numeral for the semiconductor devices is 2 collectively and 2*a*, 2*b*, and 2*c* are used to distinguish them for the description. The reference numeral for the light emitters is 32 collectively, and 32*a*, 32*b*, and 32*c* are used to distinguish them for the description.

Recesses 26 for mounting the semiconductor device 2 are formed in the device mounting surface 25 of the housing 1. The plurality of semiconductor devices 2 before being mounted on the recesses 26 are arranged on a tray (not shown), and the semiconductor devices 2 are moved from the tray to the recesses 26 by a device moving mechanism (not shown) of the device inspection apparatus 50. After the inspection, the semiconductor devices 2 are moved from the recesses 26 to another tray (not shown) by the device moving mechanism of the device inspection apparatus 50. The device moving mechanism is operated by the operation unit 5. Note that the movement of the semiconductor devices 2 to the recesses 26 and the movement of the semiconductor devices 2 from the recesses 26 may be performed manually.

The inspection unit 4 applies an electric signal for each of the semiconductor devices 2 to the semiconductor devices 2 to measure inspection value data data1 for each of the semiconductor devices 2. More specifically, the inspection unit 4 includes a current and voltage source 29 that supplies a DC voltage and an electric signal such as a control signal to the electrode 11 of the semiconductor device 2 via the probe 33, and an adapter 28 that communicates with the computer 8, and the like. The adapter 28 inspects the semiconductor device 2 on the basis of a control signal sigc from the computer 8, and outputs the measured inspection value data data1 to the computer 8. The computer 8 includes a control unit 17, an inspection determination unit 18, a storage unit 16, and an analysis unit 15. The control unit 17 outputs the control signal sigc to the inspection unit 4 to control the inspection unit 4. The inspection unit 4 operates the semiconductor device 2 on the basis of the control signal sigc, and outputs the operation result as the inspection value data data1 to the computer 8. When the semiconductor device 2 is inspected, data is written in the semiconductor device 2 according to inspection items, and voltage application by the current and voltage source 29 is performed by the inspection unit 4.

The inspection determination unit 18 determines whether the semiconductor device 2 is non-defective or defective, which is non-defectiveness determination, on the basis of the inspection value data data1. The storage unit 16 stores inspection result data data3 including the inspection value data data1 and non-defectiveness determination result data2 being a result of non-defectiveness determination of the semiconductor device 2. The analysis unit 15 analyzes whether or not there is a significant difference between the plurality of inspection result data data3 for each of the probe heads 3 by statistical processing based on the plurality of inspection result data data3 present for each of the inspection items and stored in the storage unit 16, and determines that a probe head concerned is abnormal if there is a significant difference. The significant difference is a difference that is observed statistically or through statistical processing. The determination that the probe head is abnormal corresponds to the abnormality determination of the probe head.

The warning unit 41 includes, for example, the light emitter 32 that is provided for each of the probe heads 3 and indicates the result of abnormality determination by light, and an alarm 6 that indicates the result of abnormality determination by sound when at least one probe head 3 is determined to be abnormal. When the probe head 3 is determined to be abnormal, the light emitter 32 corresponding to the probe head 3 emits light. When the probe head 3 is not determined to be abnormal, that is, when the probe head 3 is normal, the light emitter 32 corresponding to the probe head 3 does not emit light. When the analysis unit 15 determines that the probe head 3 is abnormal, an abnormality determination light emission signal sig1 and an abnormality determination alarm signal sig2 that indicate the abnormality determination are output to the warning unit 41 via the control unit 17. The abnormality determination light emission signal sig1 is output for each of the probe heads 3. The light emitter 32 emits light when the abnormality determination light emission signal sig1 indicates the abnormality determination, and does not emit light when the abnormality determination light emission signal sig1 does not indicate the abnormality determination. The alarm 6 sounds when the abnormality determination alarm signal sig2 indicates the abnormality determination, and does not sound when the abnormality determination alarm signal sig2 does not indicate the abnormality determination. The alarm 6 is installed in a room or the like where the inspection unit 4, the operation unit 5, the housing 1, and the device inspection apparatus 50 are disposed. An operator of the device inspection apparatus 50 sets conditions from the operation unit 5 for performing analysis in the analysis unit 15 as a part of the operation of the computer 8.

The device inspection apparatus 50 inspects electrical characteristics of the semiconductor device 2 by applying an electrical signal to the semiconductor device 2. Here, the inspection of the electrical characteristics of the semiconductor device 2 by applying an electrical signal to operate the semiconductor device 2 is referred to as a dynamic characteristic inspection. The inspection of the characteristics of the semiconductor device 2, such as that of the resistance, without applying an electric signal that causes the semiconductor device 2 to function, is referred to as a static characteristic inspection. When the semiconductor device 2 is the infrared sensor, an example of the dynamic characteristic inspection is an inspection for adjusting the infrared sensor on the basis of image data detected by the infrared sensor using radiant heat radiated from a black body furnace. The output voltage of the infrared sensor changes depending on a change in the amount of incident infrared rays, and in the dynamic characteristic inspection, whether or not the degree of the amount of change is within a specification range is inspected. The black body furnace is disposed in the device inspection apparatus 50 so as to face the detection surface of the infrared sensor, and radiates radiant heat at a constant temperature. When a desired characteristic can be obtained while the infrared sensor is adjusted, it is determined to be a non-defective device. When the adjustment cannot be completed and desired characteristics cannot be obtained, it is determined to be a defective device.

The device inspection apparatus 50 determines that the semiconductor device 2 is a defective device when a current does not flow even if a voltage is applied to the semiconductor device 2 in the dynamic characteristic inspection of each of inspection items. The defective device is determined by the inspection determination unit 18. The inspection determination unit 18 of the inspection apparatus 50 determines that the semiconductor device 2 is non-defective when the inspection value data data1 of the semiconductor device 2 satisfies a determination criteria. The result of determination of whether the semiconductor device 2 is non-defective or defective, that is, the non-defectiveness determination result data2, is stored in the storage unit 16 together with the inspection value data data1. Every time the inspection result data data3 including the inspection value data data1 and the non-defectiveness determination result data2 is stored in the storage unit 16, the analysis unit 15 performs an analysis by statistical processing on the basis of the inspection result data data3.

Next, an analysis method executed by the analysis unit 15 will be described. An example of inspection results of the dynamic characteristic inspection in the case of three probe heads 3 is shown in FIG. 5 to FIG. 7. FIG. 8 shows an example of an inspection result of the dynamic characteristic inspection when the number of probe heads 3 is N. An inspection result 63 shown in FIG. 7 and an inspection result 64 shown in FIG. 8 are examples in which specific numerical values are described. An inspection result 61 shown in FIG. 5 is the first inspection result for 15 days in a certain inspection item. An inspection result 62 shown in FIG. 6 is the m-th inspection result for 15 days in the same inspection item as in the inspection result 61. The inspection result 63 shown in FIG. 7 is the first inspection result describing specific numerical values for 15 days in the same inspection item as in the inspection results 61 and 62. The inspection result 64 shown in FIG. 8 is the first inspection result describing specific numerical values for 15 days in the same inspection item as in the inspection results 61 and 62.

In the inspection results 61, 62, and 63, to the probe heads 3*a*, 3*b*, and 3*c*, a symbol PH is assigned each and numbers 1, 2, and 3 are assigned, respectively. The inspection results of PH1, PH2, and PH3 in the first inspection on January 1 are d1a0101, d2a0101, and d3a0101, respectively. The number on the right side of "d" is the number of the probe head, "a" is a symbol indicating an inspection item, the two-digit number on the right side of "a" indicates the date, and the two-digit number on the right side thereto indicates the ordinal number of the inspection. In the inspection result 62, the ordinal number of the inspection is indicated by m. The inspection result in each of the columns of the inspection results 61 and 62 is, for example, the inspection value data data1 of each of the different semiconductor devices 2 or the inspection result data data3 of each of the different semiconductor devices 2. In the case of the inspection result data data3, since the inspection value data data1 and the non-defectiveness determination result data2 are included, the inspection result in each of the columns of the inspection results 61 and 62 should be two dimensional vectors. That is, the inspection result data data3 is represented by, for example, a two dimensional vector. In the following description, it is assumed that the inspection result data3 is described in each of the columns of the inspection results 61 and 62.

In the inspection result 61, the inspection result data data3 of the first probe head 3*a*, that is, PH1, on January 1 to January 15 is d1a0101 to d1a1501, respectively. Similarly, in the inspection result 61, the inspection result data data3 of the second probe head 3*b*, that is, PH2, on January 1 to January 15 is d2a0101 to d2a1501, respectively, and the inspection result data data3 of the third probe head 3*c*, that is, PH3, on January 1 to January 15 is d3a0101 to d3a1501, respectively. In the inspection result 62, the inspection result data data3 of PH1 on January 1 to January 15 is d1a01m to d1a15m, respectively. Similarly, in the inspection result 62, the inspection result data data3 of PH2 on January 1 to January 15 is d2a01m to d2a15m, respectively, and the inspection result data data3 of PH3 on January 1 to January 15 is d3a01m to d3a15m, respectively. Note that FIG. 5 to FIG. 7 show examples in which the inspection results are arranged in order of date, but the inspection results may be arranged in order of a device number individually set or the like.

First, as the first analysis, the analysis unit 15 analyzes whether or not the inspection value data data1 in the inspection result of each probe head 3 is normally distributed. When the data is not normally distributed, the analysis unit 15 determines that the probe head 3 that is out of the normal distribution is abnormal. The data analysis for analyzing whether or not normal distribution occurs is based on the determination by, for example, a value of a chi-square distribution table at a significance level of 5% from the chi-square value of the target data. The chi-square distribution table summarizes the critical values according to statistical degrees of freedom and significance levels. For example, the critical value at one degree of freedom and the significance level of 5% is 3.84. In the inspection result 63 of FIG. 7, the third probe head 3*c*, namely PH3, is determined to be out of the normal distribution. In this case, the analysis unit 15 outputs the abnormality determination light emission signal sig1 and the abnormality determination alarm signal sig2 that indicate the abnormality determination to the warning unit 41 via the control unit 17.

Next, the analysis unit 15 performs the second analysis. As the second analysis, when the inspection value data data1 in the inspection result of the probe heads 3 is normally distributed, the analysis unit 15 detects whether there is a difference between the probe heads 3 from the inspection results of all the probe heads 3 performing the inspection, that is, the significant difference between the probe heads 3 by using a variance analysis method. The determination of the presence or absence of the significant difference in the variance analysis, that is, the significant difference determination, is performed at a significance level of 5%. In FIG. 5 to FIG. 7, examples are shown in which the target range of the significant difference determination is 15 data for each of the three probe heads 3*a*, 3*b*, and 3*c*. In FIG. 8, three probe heads, that is, PH1, PH2, and PH3, are shown as the target range of the significant difference determination to be performed first. For the second and subsequent times, three or less of PH4 to PHN are to be set next to PH3.

When it is found that there is a significant difference in any of the probe heads 3 by the variance analysis method, the analysis unit 15 performs the third analysis. As the third analysis, the analysis unit 15 identifies which probe head 3 has a significant difference compared with the other probe heads 3 by multiple comparison. Note that, when the number of probe heads 3 is N and the number of probe heads 3 is large as in the inspection result 64 of FIG. 8, the probe heads 3 to be compared are divided. For example, when the number of probe heads 3 is six, the comparison among the first to third probe heads 3, that is, PH1 to PH3, and the comparison among the fourth to sixth probe heads 3, that is, PH4 to PH6, are performed. The maximum number of targets for the multiple comparison is desirably 4 or less.

As a method for the multiple comparison, first, whether or not there is a significant difference between the probe heads 3 is determined as follows. For example, the Bonferroni method is used for the multiple comparison. For example, as shown in FIG. 4, a case where the inspection is performed by three probe heads 3 is considered. In the comparison of the three probe heads 3, a t test is performed between each pair of the two probe heads 3, that is, between the first probe head 3*a*, i.e., PH1 and the second probe head 3*b*, i.e., PH2, between PH1 and the third probe head 3*c*, i.e., PH3, and between PH2 and PH3, using a level 5% divided by 3 as the significance level. For example, in a case where there is a significant difference between PH1 and PH2 (determination 1), there is no significant difference between PH1 and PH3 (determination 2), and there is a significant difference between PH2 and PH3 (determination 3), it is determined that PH2 common to determination 1 and determination 3 that are determined to have significant differences is abnormal. When it is determined that PH2 is abnormal, the analysis unit 15 outputs the abnormality determination light emission signal sig1 and the abnormality determination alarm signal sig2 that indicate the abnormality determination of PH2 to the warning unit 41 via the control unit 17. The light emitter 32 provided on the second probe head 3*b* emits light.

Note that the method of the multiple comparison is not limited to the Bonferroni method, and can be set freely depending on the data to be analyzed.

FIG. 2 to FIG. 4 illustrate an example in which the light emitter 32 of the warning unit 41 is provided in each probe head 3 to be able to distinguish which probe 3 is abnormal. Information of the probe head 3 in which an abnormality has occurred, that is, abnormality information of the probe head 3, may be displayed on the operation unit 5. For example, in the operation unit 5, the number of the probe head 3 set so as to distinguish which probe head 3 has an abnormality is displayed. The abnormality information of the probe head 3 displayed on the operation unit 5 may not be the probe number, and a schematic diagram of the apparatus may be displayed, and the color of the picture of a probe head 3 in which the abnormality has occurred may be changed with respect to the probe heads 3 drawn in the schematic diagram.

As described above, conditions for performing analysis in the analysis unit 15 are freely set as a part of the operation of the computer 8 from the operation unit 5. The conditions for performing the analysis are, for example, the number of data, a period, a determination value, and a method that are for performing the significant difference determination by the analysis unit 15. The setting of the number of data is, for example, a setting of using 100 inspection results in the past, a setting of using 50 inspection results in the past, or the like from the latest inspection result. The setting of the period is, for example, a setting of using the inspection results for the past 10 days, a setting of using the inspection results for the past 5 days, or the like from the latest inspection result. The setting of the determination value is a setting of a reference value for determining whether or not there is a significant difference, and is, for example, a setting of 5%, setting of 1%, or the like. The setting of the method is a setting of the determination method, and a setting on whether to use the inspection result data data3 or a processed value of the inspection result data data3. For example, there are a setting for determining a significant difference by a non-defective rate or a defective rate by all inspection items, a setting for determining a significant difference by an average value of one inspection item, or the like. The non-defective rate or the defective rate is a rate based on the non-defectiveness determination result data2. The above-described average value of one inspection item is the processed value of the inspection value data data1, for example, an average value of voltages or the like.

A device inspection method for the device inspection apparatus 50 will be described with reference to FIG. 9. In the device inspection method according to Embodiment 1, the plurality of semiconductor devices 2 are inspected in parallel. In step ST01, the inspection apparatus 50 performs inspection of the semiconductor devices 2 (inspection procedure). The probe head 3 having the probes 33 to be in contact with the electrodes 11 of a semiconductor device 2 is used for each of the semiconductor devices 2 to measure inspection value data data1 for each of the semiconductor devices 2. In step ST02, determination is made on the inspection value data data1 (inspection determination procedure) in the inspection determination unit 18. The inspection determination unit 18 determines whether the semiconductor devices 2 are non-defective or defective on the basis of the inspection value data data1. In step ST03, the inspection value data data1 and the determination result of step ST02 (non-defectiveness determination result data2) are stored in the storage unit 16 (storage procedure). The storage unit 16 stores the inspection result data data3 including the inspection value data data1 and the determination result (non-defectiveness determination result data2) of the semiconductor devices 2 obtained in the step ST02.

In step ST04, the analysis unit 15 performs an analysis by statistical processing (analysis procedure). The analysis unit 15 performs statistical processing on the basis of the plurality of inspection result data data3 present for each of the inspection items and stored in the storage procedure of step ST03, analyzes whether there is a significant difference between the plurality of inspection result data data3 for each of the probe heads 3, and performs abnormality determination that a probe head 3 concerned is abnormal if there is a significant difference. In step ST05, a warning is issued using the warning unit 41 in the case of the abnormality determination (warning procedure). The device inspection apparatus 50 indicates the result of abnormality determination to the warning unit 41. In step ST06, it is determined whether or not a semiconductor device 2 as an inspection target is remaining. In a case where an inspection target remains, the process returns to step ST01 and steps ST01 to ST05 are executed, and in a case where an inspection target does not remain, the processing ends.

The functions of the control unit 17, the inspection determination unit 18, and the analysis unit 15 are implemented by a processor 98 and a memory 99 included in the computer 8. The control unit 17, the inspection determination unit 18, and the analysis unit 15 are implemented by the processor 98 executing a program stored in the memory 99. In addition, a plurality of the processors 98 and a plurality of the memories 99 may execute each function in cooperation with each other. The storage unit 16 is different from a storage area of the program, and is an area of the memory 99 used by the computer 8 for calculation. The control unit 17, the inspection determination unit 18, and the analysis unit 15 are configured by application software. Note that the control unit 17, the inspection determination unit 18, and the analysis unit 15 may be configured by a device other than the computer 8 as long as the functions thereof are implemented by the processor 98 and the memory 99.

The abnormality of the probe that causes to erroneously determine a non-defective device to be a defective device also occurs in the following cases. When the semiconductor device 2 is inspected, the semiconductor device 2 is arranged at a predetermined place of the device inspection apparatus 50, that is, in the recess 26 of the housing 1, the probe head 3 is moved by the moving mechanism 20 such as the air cylinder 23 and the actuator 24, and the probe 33 of the probe head 3 comes into contact with the electrode 11 of the semiconductor device 2. When the movement mechanism 20 malfunctions, the probe head 3 and the semiconductor device 2 to be inspected collide with each other to damage the probe head 3, and an abnormality of the probe head 3 such as bending of the probe 33 may occur. The abnormality of the probe head 3 is also caused by deformation of the tip of the probe 33, adhesion of a foreign substance, breakage of a spring in the probe in the case of a contact probe, or the like.

The contact failure between the semiconductor device 2 to be inspected and the probe head 3 does not occur in every measurement, and the contact failure may or may not occur. Therefore, it is difficult to determine whether the semiconductor device 2 is defective or the probe head 3 is abnormal unless some measures are taken. Further, in an apparatus for inspecting the plurality of semiconductor devices 2 in parallel by using the plurality of probe heads 3, since it may be difficult to determine which probe head 3 has caused the collision between the probe head 3 and the semiconductor device 2, it may be difficult to identify the probe head 3 in which the abnormality has occurred, unless some measures are taken.

The device inspection apparatus 50 of Embodiment 1 analyzes whether or not there is a significant difference between the plurality of inspection result data data3 for each of the probe heads 3 by statistical processing based on the plurality of inspection result data data3 stored in the storage unit 16. Therefore, at the time when the device inspection of the semiconductor devices 2 as the inspection targets is finished, it is possible to detect the abnormality of the probe head 3 together with the result of the inspection targets, that is, the non-defectiveness determination result data2.

The abnormality of the probe head 3 includes a failure of the probe head 3 and a sign of the failure. The sign of a failure is, for example, an occurrence of a phenomenon in which the inspection sometimes fails, or an occurrence of a phenomenon in which inspection results having values different from normal values frequently occurs, or the like. One of the causes of the sign of the failure is that a foreign substance or the like is caught in the probe 33 of the probe head 3. This is the same as the adhesion of a foreign substance to the tip of the probe 33 described above. In the case of the sign of the failure, an inspection is performed using a monitor sample or the like in order to distinguish whether it is caused by the probe head or the inspection target. The cause is separated by this inspection, and when it is caused by the probe head, the probe head is replaced or repaired. When there is no sign of the failure and the probe head 3 is completely failed, it is considered that defects frequently occur only in the failed probe head 3.

The device inspection apparatus 50 of Embodiment 1 inspects the semiconductor devices 2 to be inspected to the end without stopping the inspection in the middle even when an abnormality of the probe head 3 is detected. The semiconductor device 2 determined to be a defective device due to the abnormality of the probe head 3 is inspected again after performing maintenance such as replacement, repair, and foreign substance removal of the probe head 3.

The device inspection apparatus 50 and the device inspection method according to Embodiment 1 can perform the dynamic characteristic inspection on the plurality of semiconductor devices 2 in parallel, that is, at the same time by the plurality of probe heads 3, and can analyze whether or not an abnormality in the probe heads 3 occurs during the inspection. Furthermore, in the device inspection apparatus 50 and the device inspection method according to Embodiment 1, when an abnormality in the probe heads 3 is detected, the operator can be informed of the abnormality by the operation unit 5, the warning unit 41 via the sound or light emission or the like. Even when the status of automatic operation is displayed on the operation unit 5, the light emitter 32 of the warning unit 41 is caused to emit light, so that the probe head 3 in which an abnormality has occurred can be visually recognized. In the device inspection apparatus 50 and the device inspection method according to Embodiment 1, since the conditions for performing the analysis, that is, the number of data, the period, the determination value, and the method can be set freely, the accuracy of the abnormality detection of the probe head 3 and the period until the abnormality detection can be adjusted.

Since the device inspection apparatus 50 and the device inspection method according to Embodiment 1 can detect an abnormality of the probe head 3 including the failure and the defect of the probe head 3 during the inspection, so that the probe head 3 can be repaired or parts thereof can be replaced as soon as possible. Since the device inspection apparatus 50 and the device inspection method according to Embodiment 1 can detect an abnormality of the probe head 3 during the inspection, it is possible to avoid the semiconductor device 2 that is originally a non-defective device from being erroneously determined as a defective device, and to prevent the non-defective device from being discarded. In addition, the device inspection apparatus 50 and the device inspection method according to Embodiment 1 can correctly measure the inspection value data data1, so that the yield, the inspection distribution, and the like can be correctly obtained.

As described above, the device inspection apparatus 50 according to Embodiment 1, which is the device inspection apparatus to inspect the plurality of semiconductor devices 2 in parallel, includes the housing 1 in which the plurality of semiconductor devices 2 are mounted, the plurality of probe heads 3 having probes 33 to be in contact with electrodes 11 of each of the semiconductor devices 2 and used individually for each of the semiconductor devices 2, the inspection unit 4 to measure inspection value data data1 for each of the semiconductor devices 2 by applying an electric signal for each of the plurality of semiconductor devices 2 for the plurality of semiconductor devices 2, and the inspection determination unit 18 to determine whether the semiconductor devices 2 are non-defective or defective on the basis of the inspection value data data1. The device inspection apparatus 50 of Embodiment 1 further includes the storage unit 16 to store the inspection result data data3 including the inspection value data data1 and the determination result on the semiconductor devices 2 (non-defectiveness determination result data2), the analysis unit 15 to analyze whether or not there is a significant difference between the plurality of inspection result data data3 for each of the probe heads 3 by statistical processing based on the plurality of inspection result data data3 present for each of inspection items and stored in the storage unit 16 and to determine that a probe head 3 concerned is abnormal if there is a significant difference, and the warning unit 41 to indicate a result of abnormality determination in the analysis unit 15 that the probe head 3 concerned is abnormal. With this configuration, the device inspection apparatus 50 according to Embodiment 1 analyzes whether or not there is a significant difference between the plurality of inspection result data data3 for each of the probe heads 3 by statistical processing based on the plurality of inspection result data data3 stored in the storage unit 16. Therefore, at the time when the device inspection of the inspection targets (semiconductor devices 2) is finished, the abnormality of the probe head 3 can be detected together with the result of the inspection targets (semiconductor devices 2).

The device inspection method of Embodiment 1 is a device inspection method for inspecting the plurality of semi-conductor devices 2 in parallel, and includes an inspection procedure for measuring the inspection value data data1 for each of the semiconductor devices 2 by using the plurality of probe heads 3 having the plurality of probes 33 to be in contact with the plurality of electrodes 11 for each of the semiconductor devices 2, and an inspection determination procedure for determining whether the semiconductor devices 2 are non-defective or defective on the basis of the inspection value data data1. The device inspection method of Embodiment 1 further includes a storage procedure for storing the inspection result data data3 including inspection value data data1 and the determination result on the semiconductor devices 2 (non-defectiveness determination result data2), an analysis procedure for performing statistical processing on the basis of the plurality of inspection result data data3 present for each of the inspection items and stored by the storage procedure, analyzing whether or not there is a significant difference between the plurality of inspection result data data3 for each of the probe heads 3, and determining that a probe head 3 concerned is abnormal if there is a significant difference, and a warning procedure for indicating the result of abnormality determination in the analysis procedure that the probe head 3 concerned is abnormal. With this configuration, the device inspection method of Embodiment 1 performs statistical processing based on the plurality of inspection result data data3 stored in the storage procedure to analyze whether there is a significant difference between the plurality of inspection result data data3 for each of the probe heads 3. Therefore, at the time when the device inspection of the inspection targets (semiconductor devices 2) is finished, the abnormality of the probe head 3 can be detected together with the result of the inspection targets (semiconductor devices 2).

Embodiment 2

Figure 11:
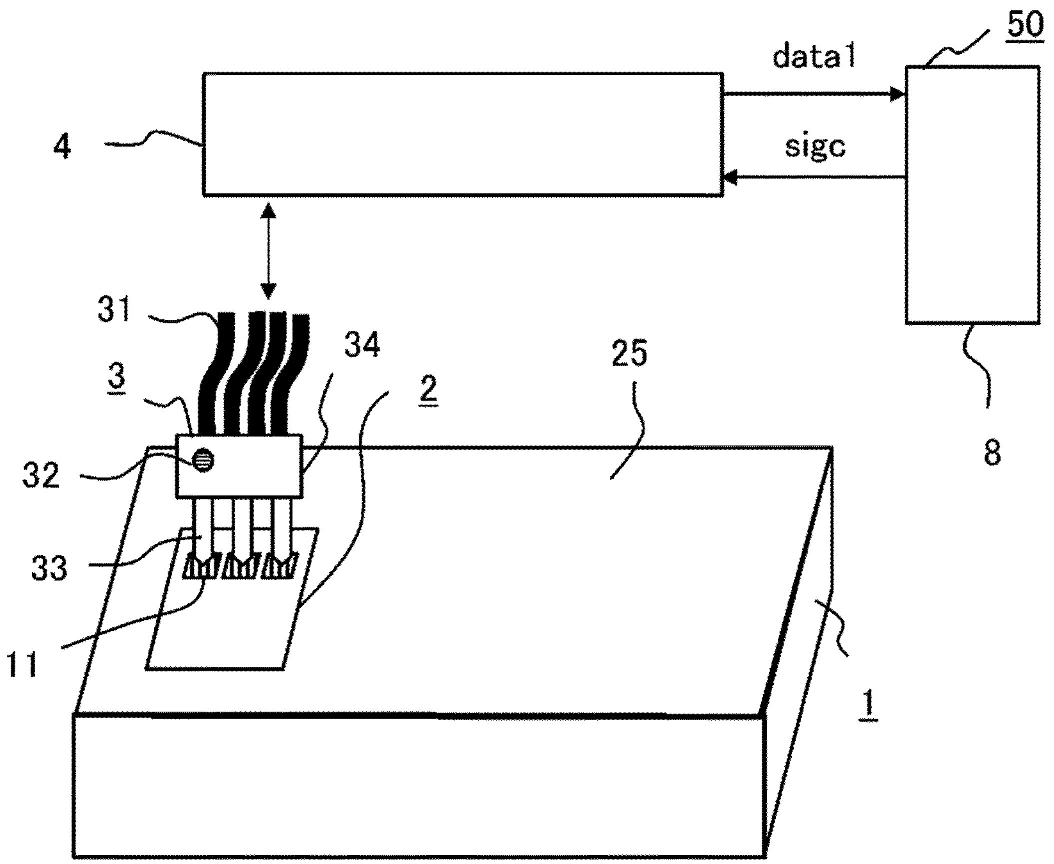
FIG. 11 is a diagram showing a configuration of a device inspection apparatus according to Embodiment 2.

FIG. 11 is a diagram showing a configuration of a device inspection apparatus according to Embodiment 2, and FIG. 12 is a diagram showing an example of an inspection result according to Embodiment 2. The device inspection apparatus 50 of Embodiment 2 is different from the device inspection apparatus 50 of Embodiment 1 in that one semiconductor device 2 is inspected in one inspection. Differences from the device inspection apparatus 50 according to Embodiment 1 will be mainly described.

FIG. 11 shows an example in which one semiconductor device 2 is mounted on the housing 1 and the probes 33 of one probe head 3 are in contact with the electrodes 11 of the semiconductor device 2. Note that, in FIG. 11, the operation unit 5 and the alarm 6 are omitted. Only three of the plurality of electrodes 11 in the semiconductor device 2 are shown. In Embodiment 2, the past inspection result and the latest inspection result of the one probe head are compared to analyze whether there is a significant difference in the latest inspection result. With such an analysis, it is detected whether or not there is an abnormality in the probe head 3 under inspection. When one semiconductor device 2 is inspected by using one probe head 3 selected from the plurality of probe heads 3, the latest inspection result and the past inspection result in the probe head 3 are used in order to detect the abnormality of the selected probe head 3.

An inspection result for each specific probe head 3 is to be held for those of a certain period of time and a certain number of inspection data. The inspection result for each specific probe head 3 may be stored in a unit other than the storage unit 16 of the computer 8. However, the inspection result of the probe head 3 under inspection is stored in the storage unit 16. The inspection result 65 shown in FIG. 12 is the first to m-th inspection results for 15 days in a certain inspection item in the first probe head 3. The inspection result on January 1 is d1a0101 to d1a01m. As described in Embodiment 1, the number on the right side of "d" is the number of the probe head, "a" is a symbol indicating an inspection item, the two-digit number on the right side of "a" indicates the date, and the two-digit number on the right side thereto indicates the ordinal number of the inspection. Note that the ordinal number of the m-th inspection is m.

The first inspection result data data3 on January 1 to January 15 is d1a0101 to d1a1501, respectively. Similarly, the second inspection result data data3 on January 1 to January 15 is d1a0102 to d1a1502, respectively, the third inspection result data data3 on January 1 to January 15 is d1a0103 to d1a1503, respectively, and the m-th inspection result data data3 on January 1 to January 15 is d1a01m to d1a15m, respectively.

In the device inspection apparatus 50 according to Embodiment 2, similarly to the device inspection apparatus 50 according to Embodiment 1, conditions for performing analysis in the analysis unit 15 is set freely as a part of the operation of the computer 8 from the operation unit 5. The conditions for performing the analysis are, for example, the number of data, a period, a determination value, and a method that are for performing the significant difference determination by the analysis unit 15.

The recess 26 for mounting the semiconductor device 2 is formed in the device mounting surface 25 of the housing 1. Note that the recess 26 is omitted in FIG. 11. The inspection unit 4 applies an electric signal to the semiconductor device 2 to measure the inspection value data data1 of the semiconductor device 2. The inspection determination unit 18 determines whether the semiconductor device 2 is non-defective or defective, which is the non-defectiveness determination, on the basis of the inspection value data data1. The storage unit 16 stores the inspection result data data3 including the inspection value data data1 and the result of the non-defectiveness determination of the semiconductor device 2, that is, the non-defectiveness determination result data2. The analysis unit 15 analyzes whether or not there is a significant difference between the plurality of inspection result data3 by statistical processing based on the plurality of inspection result data3 present for each of the inspection items and stored in the storage unit 16, and determines that the probe head 3 is abnormal if there is a significant difference. The determination that the probe head is abnormal corresponds to the abnormality determination of the probe head. The warning unit 41 indicates the result of abnormality determination of the probe head 3 by light and/or sound.

A device inspection method for the device inspection apparatus 50 according to Embodiment 2 will be described with reference to FIG. 9. In the device inspection method according to Embodiment 2, one semiconductor device 2 is inspected. In step ST01, the device inspection apparatus 50 performs inspection of the semiconductor device 2 (inspection procedure). The inspection value data data1 of the semiconductor device 2 is measured using the probe head 3 having the probes 33 to be in contact with the electrodes 11 of the semiconductor device 2. In step ST02, by the inspection determination unit 18, determination on the inspection value data data1 is made (inspection determination procedure). The inspection determination unit 18 determines whether the semiconductor device 2 is non-defective or defective on the basis of the inspection value data data1. In step ST03, the inspection value data data1 and the determination result of step ST02 (non-defectiveness determination result data2) are stored in the storage unit 16 (storage procedure). The storage unit 16 stores the inspection result data data3 including the inspection value data data1 and the determination result on the semiconductor device 2 (non-defectiveness determination result data2) in the step ST02.

In step ST04, the analysis unit 15 performs an analysis by statistical processing (analysis procedure). The analysis unit 15 performs statistical processing based on the plurality of inspection result data data3 present for each of the inspection items and stored in the storage procedure of step ST03, analyzes whether there is a significant difference between the plurality of inspection result data data3, and performs abnormality determination that the probe head 3 is abnormal if there is a significant difference. In step ST05, a warning is issued using the warning unit 41 in the case of abnormality determination (warning procedure). The device inspection apparatus 50 indicates the result of abnormality determination to the warning unit 41. In step ST06, it is determined whether or not a semiconductor device 2 as an inspection target is remaining. In a case where the inspection target remains, the process returns to step ST01 and steps ST01 to ST05 are executed, and in a case where the inspection target does not remain, the process ends.

In the device inspection apparatus 50 and the device inspection method of Embodiment 2, since the target data for detecting the abnormality of the probe head 3 is the latest inspection result and the past inspection result in the same probe head 3, it is possible to detect the abnormality of the probe head 3 even when the plurality of semiconductor devices 2 are not inspected in parallel.

As described above, the device inspection apparatus 50 according to Embodiment 2, which is the device inspection apparatus to inspect the semiconductor device 2, includes the housing 1 in which the semiconductor device 2 is mounted, the probe head 3 having the probes 33 to be in contact with the electrodes 11 of the semiconductor device 2, the inspection unit 4 to measure the inspection value data data1 of the semiconductor device 2 by applying an electric signal to the semiconductor device 2, and the inspection determination unit 18 to determine whether the semiconductor device 2 is non-defective or defective on the basis of the inspection value data data1. The device inspection apparatus 50 of Embodiment 2 further includes the storage unit 16 to store inspection result data data3 including the inspection value data data1 and the determination result on the semiconductor device 2 (non-defectiveness determination result data2), the analysis unit 15 to analyze whether or not there is a significant difference between the plurality of inspection result data data3 by statistical processing based on the plurality of inspection result data data3 present for each of the inspection items and stored in the storage unit 16 and to determine that the probe head 3 is abnormal if there is a significant difference, and the warning unit 41 to indicate a result of abnormality determination of the analysis unit 15 that the probe head 3 is abnormal. With this configuration, the device inspection apparatus 50 according to Embodiment 2 analyzes whether or not there is a significant difference between the plurality of inspection result data data3 by statistical processing based on the plurality of inspection result data data3 stored in the storage unit 16. Therefore, at the time when the device inspection of the inspection target (semiconductor device 2) is finished, the abnormality of the probe head 3 can be detected together with the result of the inspection target (semiconductor device 2).

The device inspection method of Embodiment 2 is a device inspection method for inspecting the semiconductor device 2 and includes an inspection procedure for measuring the inspection value data data1 of the semiconductor device 2 by using the probe head 3 having the probes 33 to be in contact with the electrodes 11 of the semiconductor device 2, and an inspection determination procedure for determining whether the semiconductor device 2 is non-defective or defective on the basis of the inspection value data data1. The device inspection method of Embodiment 2 further includes a storage procedure for storing the inspection result data data3 including inspection value data data1 and the determination result on the semiconductor device 2 (non-defectiveness determination result data2), an analysis procedure for performing statistical processing on the basis of the plurality of inspection result data data3 present for each of the inspection items and stored by the storage procedure, analyzing whether or not there is a significant difference between the plurality of inspection result data data3, and determining that the probe head 3 is abnormal if there is a significant difference, and a warning procedure for indicating the result of abnormality determination in the analysis procedure that the probe head 3 is abnormal. With this configuration, the device inspection method of Embodiment 2 performs statistical processing on the basis of the plurality of inspection result data data3 stored in the storage procedure to analyze whether there is a significant difference between the plurality of inspection result data data3. Therefore, at the time when the device inspection of the inspection target (semiconductor device 2) is finished, the abnormality of the probe head 3 can be detected together with the result of the inspection target (semiconductor device 2).

Embodiment 3

Figure 13:
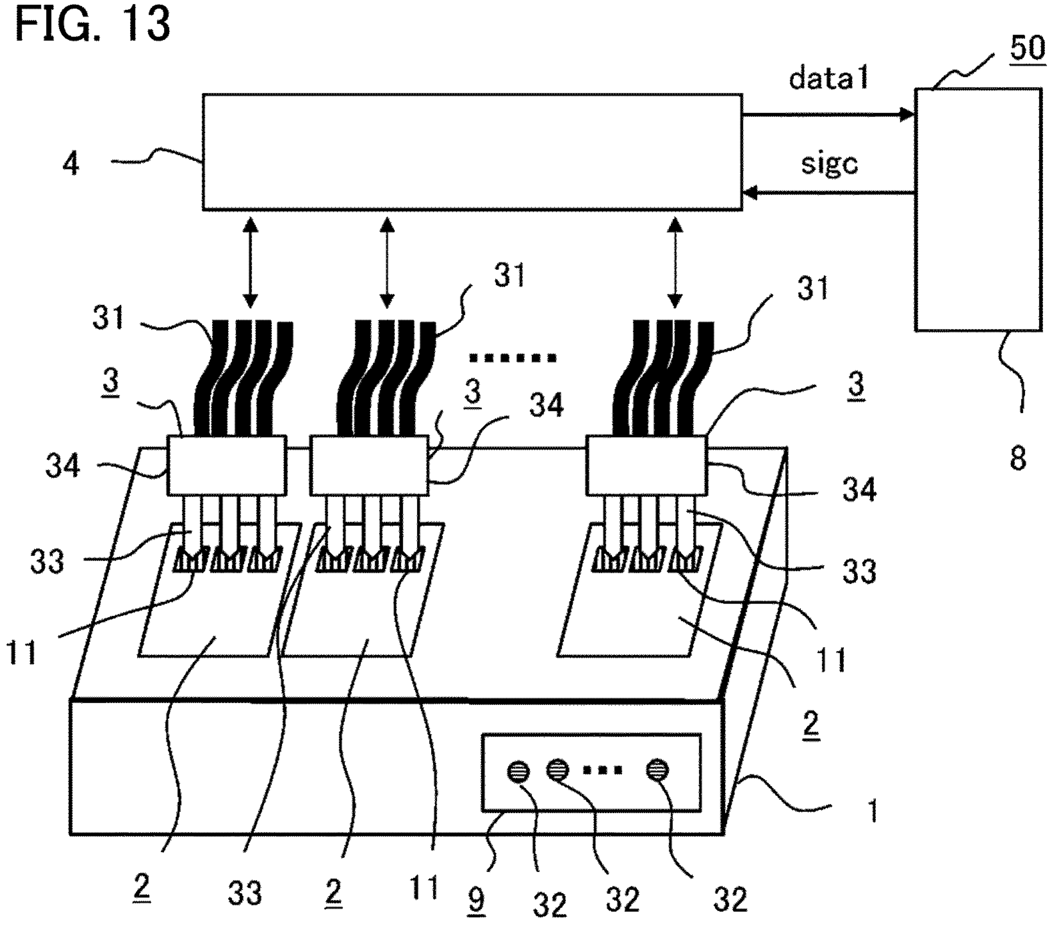
FIG. 13 is a diagram showing a configuration of a device inspection apparatus according to Embodiment 3.

FIG. 13 is a diagram showing a configuration of a device inspection apparatus according to Embodiment 3. The device inspection apparatus 50 according to Embodiment 3 is different from the device inspection apparatus 50 according to Embodiment 1 in that light emitters 32 of the warning unit 41 are provided at a position different from the main part 34 of the probe head 3. Differences from the device inspection apparatus 50 according to Embodiment 1 will be mainly described.

FIG. 13 illustrates an example in which a light emitter 32 is not disposed in the main part 34 of each probe head 3, and instead, the light emitters 32 corresponding to the respective probe heads 3 are collectively disposed in a light emitter unit 9 of the housing 1. Note that, in FIG. 13, the operation unit 5 and the alarm 6 are omitted. The light emitter unit 9 illustrated in FIG. 13 is an example of being arranged on the front side in the x-direction in the housing 1, and the place on the front side in the x-direction is an example of a place that is easily visually recognized by the operator. If there are N probe heads 3, the light emitter unit 9 has N light emitters 32. The light emitter unit 9 is not limited to be installed on the front side of the housing 1 in the x-direction, and may be installed at a place in the device inspection apparatus 50 that is easily visually recognized. It is likely that the probe head 3 may be in a place where it is difficult for the operator to visually recognize them. Even in this case, the device inspection apparatus 50 according to Embodiment 3 can easily check the abnormality of each probe head 3.

Note that the light emitters 32 of the warning unit 41 may be provided in the light emitter unit 9 and provided each in the main part 34 of each probe head 3 at the same time. If the light emitters 32 are provided at a plurality of places, it is possible to quickly confirm the abnormality of each probe head 3 by using the one that is easier to check.

Note that, in the device inspection apparatus 50 according to Embodiment 2, an example in which the light emitter 32 of the warning unit 41 is disposed in the main part 34 of the probe head 3 has been described. However, as in the device inspection apparatus 50 according to Embodiment 3, the light emitter 32 may be disposed in a place such as the housing 1 that is easily visually recognized by the operator.

Note that, although various exemplary embodiments and examples are described in the present application, various features, aspects, and functions described in one or more embodiments are not inherent in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: housing, 2, 2*a*, 2*b*, 2*c*: semiconductor device, 3, 3*a*, 3*b*, 3*c*: probe head, 4: inspection unit, 5: operation unit, 6: alarm,

11: electrodes, 15: analysis unit, 16: storage unit, 18: inspection determination unit, 32, 32*a*, 32*b*, 32*c*: light emitter, 33: probe, 41: warning unit, 50: device inspection apparatus, data1: inspection value data, data2: non-defectiveness determination result, data3: inspection result data

The invention claimed is:

1. A device inspection apparatus for inspecting a plurality of semiconductor devices in parallel, the apparatus comprising:

a housing in which the plurality of semiconductor devices are mounted;

a plurality of probe heads having probes to be in contact with electrodes of each semiconductor device and used individually for each of the semiconductor devices;

an inspection circuitry to measure inspection value data for each of the semiconductor devices by applying an electric signal for each of the plurality of semiconductor devices for the plurality of semiconductor devices;

an inspection determination circuitry to determine whether the semiconductor devices are non-defective or defective on a basis of the inspection value data;

a storage circuitry to store inspection result data including the inspection value data and the determination result on the semiconductor devices;

an analysis circuitry to analyze whether or not there is a significant difference between a plurality of the inspection result data for each of the probe heads by statistical processing based on a plurality of the inspection result data present for each of inspection items and stored in the storage circuitry every time the inspection result data is stored in the storage circuitry and to determine that a probe head concerned is abnormal if there is a significant difference; and a warning circuitry to indicate a result of abnormality determination in the analysis circuitry that the probe head concerned is abnormal, wherein a plurality of the inspection result data that the analysis circuitry analyzes includes past inspection result data measured by the inspection circuitry before a present inspection date in a set period.

2. The device inspection apparatus according to claim 1, further comprising:

an operation circuitry to set a condition for performing analysis in the analysis circuitry, wherein the analysis circuitry analyzes whether there is a significant difference between the inspection result data corresponding to the number of data and/or a target period that are set by the operation circuitry.

3. The device inspection apparatus according to claim 2, wherein, when a processed value of the inspection result data is set as an analysis target in the operation circuitry, the analysis circuitry analyzes whether there is a significant difference between processed values of a plurality of the inspection result data.

4. The device inspection apparatus according to claim 3, wherein the processed value of the inspection result data is an average value of the inspection value data.

5. The device inspection apparatus according to claim 4, wherein the warning circuitry includes a light emitter to indicate the result of abnormality determination for each probe head.

6. The device inspection apparatus according to claim 3, wherein the processed value of the inspection result data is a non-defective rate or a defective rate in the determination result.

7. The device inspection apparatus according to claim 6, wherein the warning circuitry includes a light emitter to indicate the result of abnormality determination for each probe head.

8. The device inspection apparatus according to claim 3, wherein the warning circuitry includes a light emitter to indicate the result of abnormality determination for each probe head.

9. The device inspection apparatus according to claim 2, wherein the warning circuitry includes a light emitter to indicate the result of abnormality determination for each probe head.

10. The device inspection apparatus according to claim 1, wherein the warning circuitry includes a light emitter to indicate the result of abnormality determination for each probe head.

11. The device inspection apparatus according to claim 10, wherein the light emitter is disposed on the probe head or/and the housing.

12. The device inspection apparatus according to claim 10, wherein the warning circuitry includes an alarm.

13. A device inspection apparatus for inspecting a semiconductor device, the apparatus comprising:

a housing in which the semiconductor device is mounted;

a probe head having probes to be in contact with electrodes of the semiconductor device;

an inspection circuitry to measure inspection value data of the semiconductor device by applying an electric signal to the semiconductor device;

an inspection determination circuitry to determine whether the semiconductor device is non-defective or defective on a basis of the inspection value data;

a storage circuitry to store inspection result data including the inspection value data and the determination result on the semiconductor device;

an analysis circuitry to analyze whether or not there is a significant difference between a plurality of the inspection result data by statistical processing based on a plurality of the inspection result data present for each of inspection items and stored in the storage circuitry every time the inspection result data is stored in the storage circuitry and to determine that the probe head is abnormal if there is a significant difference; and a warning circuitry to indicate a result of abnormality determination in the analysis circuitry that the probe head is abnormal, wherein a plurality of the inspection result data that the analysis circuitry analyzes includes past inspection result data measured by the inspection circuitry before a present inspection date in a set period.

14. The device inspection apparatus according to claim 13, further comprising:

an operation circuitry to set a condition for performing analysis in the analysis circuitry, wherein the analysis circuitry analyzes whether there is a significant difference between the inspection result data corresponding to the number of data and/or a target period that are set by the operation circuitry.

15. The device inspection apparatus according to claim 14, wherein the warning circuitry includes a light emitter to indicate the result of abnormality determination.

16. The device inspection apparatus according to claim 13, wherein the warning circuitry includes a light emitter to indicate the result of abnormality determination.

17. The device inspection apparatus according to claim 16, wherein the light emitter is disposed on the probe head or/and the housing.

18. The device inspection apparatus according to claim 16, wherein the warning circuitry includes an alarm.

19. A device inspection method for inspecting a plurality of semiconductor devices in parallel, the method comprising:

an inspection procedure for measuring inspection value data for each of the semiconductor devices by using, for each of the semiconductor devices, probe heads having probes to be in contact with electrodes of each semiconductor device;

an inspection determination procedure for determining whether the semiconductor devices are non-defective or defective on a basis of the inspection value data;

a storage procedure for storing inspection result data including the inspection value data and the determination result on the semiconductor devices;

an analysis procedure for performing statistical processing on a basis of a plurality of the inspection result data present for each of inspection items and stored by the storage procedure every time the inspection result data is stored in the storage procedure, analyzing whether or not there is a significant difference between a plurality of the inspection result data for each of the probe heads, and determining that a probe head concerned is abnormal if there is a significant difference; and a warning procedure for indicating a result of abnormality determination in the analysis procedure that the probe head concerned is abnormal, wherein a plurality of the inspection result data to be analyzed in the analysis procedure includes past inspection result data measured in the inspection procedure before a present inspection date in a set period.

20. A device inspection method for inspecting a semiconductor device, the method comprising:

an inspection procedure for measuring inspection value data of the semiconductor device by using a probe head having probes to be in contact with electrodes of the semiconductor device;

an inspection determination procedure for determining whether the semiconductor device is non-defective or defective on a basis of the inspection value data;

a storage procedure for storing inspection result data including the inspection value data and the determination result on the semiconductor device;

an analysis procedure for performing statistical processing on a basis of a plurality of the inspection result data present for each of inspection items and stored by the storage procedure every time the inspection result data is stored in the storage procedure, analyzing whether or not there is a significant difference between a plurality of the inspection result data, and determining that the probe head is abnormal if there is a significant difference; and a warning procedure for indicating a result of abnormality determination in the analysis procedure that the probe head is abnormal, wherein a plurality of the inspection result data to be analyzed in the analysis procedure includes past inspection result data measured in the inspection procedure before a present inspection date in a set period.

* * * * *